(12) United States Patent
Pettersson et al.

(10) Patent No.: US 10,475,651 B2
(45) Date of Patent: Nov. 12, 2019

(54) METHOD FOR PATTERNING A PIECE OF CARBON NANOMATERIAL AND A PROCESSED PIECE OF CARBON NANOMATERIAL

(71) Applicant: Jyväskylän yliopisto, Jyväskylä (FI)

(72) Inventors: Mika Pettersson, Jyväskylä (FI); Andreas Johansson, Jyväskylä (FI); Jukka Aumanen, Jyväskylä (FI); Pasi Myllyperkiö, Jyväskylä (FI); Juha Koivistoinen, Jyväskylä (FI)

(73) Assignee: Jyv¿skyl¿nYliopisto, Jyv¿skyl¿ (FI)

( * ) Notice: Subject to any disclaimer, the term of this patent is extended or adjusted under 35 U.S.C. 154(b) by 277 days.

(21) Appl. No.: 15/307,176

(22) PCT Filed: May 4, 2015

(86) PCT No.: PCT/FI2015/050298
§ 371 (c)(1),
(2) Date: Oct. 27, 2016

(87) PCT Pub. No.: WO2015/170005
PCT Pub. Date: Nov. 12, 2015

(65) Prior Publication Data
US 2017/0207391 A1    Jul. 20, 2017

(30) Foreign Application Priority Data
May 5, 2014   (FI) .................................... 20145408

(51) Int. Cl.
*H01L 21/268*    (2006.01)
*H01L 51/00*    (2006.01)
(Continued)

(52) U.S. Cl.
CPC .......... *H01L 21/268* (2013.01); *C01B 32/168* (2017.08); *C01B 32/194* (2017.08);
(Continued)

(58) Field of Classification Search
CPC .................. C01B 32/23; C01B 32/198; C01B 32/182–23; H01L 21/042;
(Continued)

(56) References Cited

U.S. PATENT DOCUMENTS 9,196,766 B1 *  11/2015  Egerton .................... G01J 5/20
2009/0311489 A1  12/2009  Sheehan
(Continued)

FOREIGN PATENT DOCUMENTS

| EP | 1591417 A1 | 11/2005 |
|---|---|---|
| JP | 2004284852 A | 10/2004 |
| WO | 2012079066 A2 | 6/2012 |

OTHER PUBLICATIONS

Roberts et al., "Response of graphene to femtosecond high-intensity laser irradiation", arXiv:1105.1193v1 [cond-mat.mtrl-sci], May 5, 2011.*

(Continued)

*Primary Examiner* — William F Kraig
*Assistant Examiner* — Sun Mi Kim King
(74) *Attorney, Agent, or Firm* — Berggren LLP

(57) ABSTRACT

A method for patterning a piece of carbon nanomaterial. The method comprises generating a first light pulse sequence with first light pulse sequence property values, the first light pulse sequence comprising at least one light pulse and exposing a first area of the piece of carbon nanomaterial to said first light pulse sequence in a first process environment having a first oxygen content, without exposing at least part of the piece of carbon nanomaterial to said first light pulse sequence. In this way, the method comprises oxidizing locally, in the first area, at least some carbon atoms of the piece of carbon nanomaterial in such a way that at most 10% of the carbon atoms of the first area are removed from the first area; thereby patterning the first area of the piece of (Continued)

carbon nanomaterial. In addition a processed piece of carbon nanomaterial.

17 Claims, 6 Drawing Sheets

(51) Int. Cl.
*H01L 21/04* (2006.01)
*H01L 29/16* (2006.01)
*C01B 32/168* (2017.01)
*C01B 32/194* (2017.01)
*B82Y 30/00* (2011.01)
*B82Y 40/00* (2011.01)

(52) U.S. Cl.
CPC ........ *H01L 21/042* (2013.01); *H01L 29/1606* (2013.01); *H01L 51/0017* (2013.01); *H01L 51/0027* (2013.01); *H01L 51/0048* (2013.01); *B82Y 30/00* (2013.01); *B82Y 40/00* (2013.01); *C01B 2202/02* (2013.01); *C01B 2202/06* (2013.01); *C01B 2204/02* (2013.01); *C01B 2204/04* (2013.01); *Y10S 977/734* (2013.01); *Y10S 977/745* (2013.01); *Y10S 977/75* (2013.01); *Y10S 977/752* (2013.01); *Y10S 977/847* (2013.01); *Y10S 977/932* (2013.01)

(58) Field of Classification Search
CPC ..... H01L 21/268–2683; H01L 21/0405; H01L 21/0223–02236; H01L 29/1606; H01L 29/66045
See application file for complete search history.

(56) References Cited

U.S. PATENT DOCUMENTS

| | | | |
|---|---|---|---|
| 2010/0025222 A1 | 2/2010 | Iijima | |
| 2011/0220865 A1* | 9/2011 | Miyata | B82Y 10/00 257/12 |
| 2012/0068161 A1* | 3/2012 | Lee | B82Y 30/00 257/29 |
| 2014/0019440 A1* | 1/2014 | Kim | G06F 19/34 707/722 |
| 2014/0094021 A1 | 4/2014 | Gharib | |

OTHER PUBLICATIONS

Fethullah et al UV-light-assisted oxidative sp 3 Hybridization of graphene, Nano, vol. 6, No. 5, Oct. 1, 2011, pp. 409-418, XP055199610, ISSN: 1793-2920, D01; 10.1142/S1793292011002780 abstract pp. 410-411, p. 416.
Lewis Scalable light-induced metal to semiconductor conversion of carbon nanotubes, Nano Lett., 2009, 9(10), pp. 3592-3598, Publication date (Web): Sep. 15, 2009. DOI: 10.1021/nl901802m.
Sokolov Excimer laser reduction and patterning of graphiet oxide, Carbon vol. 53 (2013) p. 81-89.
Chen Mask-free and programmable patterning of graphene by ultrafast laser direct writing, Chemical Physics vol. 430 (2014) p. 13-17 (Available online Dec. 15, 2013).
Grujicic UV-light enhanced oxidation of carbon nanotubes, Applied surface science vol. 214, Issues 1-4, May 31, 2003, p. 289-303.
Finnish Patent Office Office action and Search report of the priority application FI20145408, dated Jan. 5, 2015.
Finnish Patent Office Office action of the priority application FI20145408, dated Mar. 11, 2016.
European Patent Office International search report of PCT/FI2015/050298, dated Jul. 7, 2015.

* cited by examiner

METHOD FOR PATTERNING A PIECE OF CARBON NANOMATERIAL AND A PROCESSED PIECE OF CARBON NANOMATERIAL

PRIORITY

This application is a U.S national application of PCT-application PCT/FI2015/050298 filed on May 4, 2015 and claiming priority of Finnish national application number FI 20145408 filed on May 5, 2014, the contents of all of which are incorporated herein by reference.

FIELD OF THE INVENTION

The invention relates to a method for processing carbon nanomaterial. The invention relates to a processed piece of carbon nanomaterial. The invention relates to a method for manufacturing a carbon based electronic device. The invention relates to carbon based electronic devices.

BACKGROUND OF THE INVENTION

Carbon nano materials and graphene in particular are envisioned to be the key materials for future electronics, photonics and related technological areas. Graphene is a two-dimensional material consisting of hexagonal aromatic carbon network. It is ultrathin having a thickness of minimally only one atomic layer and it has excellent electronic properties, including conductivity, making it a potential material to be used in flexible, transparent thin electronic devices.

The problem with pristine graphene is that it has no band gap and thus it is not suitable for electronics as such. What is needed is patterning of graphene with functionalities that allow opening of a band gap and tuning of it and other electrical properties. In this regard, several strategies are being developed. One possibility is to cut graphene into narrow ribbons which have band gap due to quantum confinement and edge effects. Another possibility is to use template growth of graphene nanoribbons. However, it is very difficult and expensive to control graphene ribbons to the required degree of precision.

Laser ablation has been used for making narrow nanoribbons and for patterning graphene and for pattern transfer. In these methods, pulsed lasers were used for cutting graphene via ablation or burning. The processes could be locally controlled by focusing the laser beam to a small diameter. Patterns could be made by moving the sample under laser illumination. The key common factor in these methods is that in all of them laser is used to remove material from graphene sheet. Thus, these methods cannot be used for controlling electrical properties of patterned areas.

In this field, the publication US2009/0311489 discloses a patterning method for a carbon nanotube (CNT) layer. The method is based on focusing a laser beam on the layer and moving the sample relative to the laser beam. The effect of the laser beam is to remove CNT material by ablation or burning, thus this method can only remove material but not change its electrical properties. Thus, carbon nanomaterial with areas of different electrical properties cannot be obtained.

Another strategy involves patterning of graphene oxide (GO). GO is a form of graphene which contains chemical groups with oxygen, typically C=P, O—H and O—O—C groups. GO is made from graphite. GO is insulator and it has to be reduced to reduced GO (RGO) in order to make it conductive to some extent. However, RGO is not the same material as pristine graphene and it does not have as good electrical properties as pristine graphene. Thus, these methods suffice from obtaining carbon nanomaterial with extremely good conductivity and low band gap. Thus, RGO does not have the excellent electrical properties of pristine graphene, e.g. because of the oxidation-reduction process of graphite. Still further, if the oxidation or reduction is made using wet chemistry, the graphite for GO may become contaminated, which further worsens the electrical properties of RGO.

In addition, some of these methods require using equipment with reasonable high investment costs. Still further, the spatial accuracy of some methods is not satisfactory for future electronics requiring a line width in the 500 nm region and below.

SUMMARY OF THE INVENTION

It has been found that carbon nanomaterials can be locally patterned by means of oxidation induced by electromagnetic radiation, such as visible light, ultra violet radiation, or infrared radiation. The method is applicable to various types of carbon nanomaterials, however, in particular to material comprising graphene. The method comprises exposing carbon nanomaterial to light in an environment comprising oxygen. As a result, on one hand, the material becomes locally oxidized in a controlled manner. On the other hand, the oxidation and in particular the degree of oxidation affects the local properties (such as an electrical property, such as electrical conductivity and/or band gap) of the nanomaterial. Depending on the process parameters, different areas can be oxidized in different ways, resulting in carbon nanomaterial with at least three types of regions: un-processed, and two areas that have been processed differently. In the corresponding regions, the carbon nanomaterial has different properties.

More specifically, an embodiment of a method for patterning a piece of carbon nanomaterial; wherein the piece of carbon nanomaterial (i) has a length, a width, and a thickness, or (ii) is obtainable, e.g. by bending or rolling, from a sample of carbon nanomaterial having a length, a width, and a thickness such that the length is greater than or equal to the thickness, the width is greater than or equal to the thickness, and the thickness is at most 50 nm, the piece of carbon nanomaterial comprises a region, wherein the region comprises at least 80 mol-% carbon atoms and in the region, the molar ratio of oxygen to carbon has a base value that is equal to or greater than zero, the region comprises a first area in such a way that the first area is smaller than the region; whereby the region and the first area define a base that is comprised by the difference of the region and the first area;

comprises generating a first light pulse sequence with first light pulse sequence property values, the first light pulse sequence comprising at least one light pulse and exposing the first area to said first light pulse sequence in a first process environment having a first oxygen content, without exposing at least part of the base to said first light pulse sequence; thereby oxidizing locally, in the first area, at least some carbon atoms of the piece of carbon nanomaterial in such a way that at most 10% of the carbon atoms of the first area are removed from the first area and after said exposing the first area to said first light pulse sequence, in the first area, the molar ratio of oxygen to carbon atoms has a first value, the first value being greater than the base value; thereby patterning the first area of the piece of carbon nanomaterial.

In particular, the method can be used with a different process parameter to pattern another region in a different way.

In an embodiment, the piece of carbon nanomaterial further comprises a second area, and by said exposing the first area, the method comprises using a first set of values of process parameters to oxidize the first area, wherein the first set of values of process parameters comprises the first light pulse sequence property values and the first oxygen content. The embodiment further comprises changing at least one value of a process parameter of the first set of values of process parameters thereby generating a second set of values of process parameters, wherein at least a value of a process parameter in the first set of values of process parameters is different from the value of the process parameter in the second set of values of process parameters, generating a second light pulse sequence with second light pulse sequence property values, the second light pulse sequence property values comprised by the second set of values of process parameters, the second light pulse sequence comprising at least one light pulse, and exposing the second area to said second light pulse sequence (a) in the process environment having a second oxygen content or (b) in another process environment having a second oxygen content, the second oxygen content comprised by the second set of values of process parameters; thereby using the second set of values of process parameters to oxidize at least some carbon atoms locally in the second area in such a way that at most 10% of the carbon atoms of the second area are removed from the second area and after said exposing the second the area to said second light pulse sequence, in the second area, the molar ratio of oxygen to carbon atoms has a second value, the second value being greater than the base value and different from the first value.

In particular, the method can be used to pattern graphene. In the corresponding embodiment, the carbon nanomaterial comprises, preferably consists of, a monolayer, e.g. a planar or bent monolayer, of graphene, optionally at most partly oxidized, or multilayer graphene, e.g. planar or bent, comprising a number of graphene monolayers, wherein the number is at most 30, optionally chemically treated on at least a surface.

The method is easy to control. Thereby both insulating and semiconductive regions can be patterned onto a piece of conducting carbon nanomaterial resulting in a processed piece on nanomaterial having conductive, semiconductive, and insulating areas. Alternatively, some other property of the material (than the conductance) can be affected. The other property may be an electrical property or another property, such as luminescence. As a result, a processed piece of carbon nanomaterial is obtained. Such a processed piece of carbon nanomaterial (i) has a length, a width, and a thickness, or (ii) is obtainable, e.g. by bending or rolling, from a sample of carbon nanomaterial having a length, a width, and a thickness wherein the length is greater than or equal to the thickness, the width is greater than or equal to the thickness, and the thickness is at most 50 nm, the processed piece of carbon nanomaterial comprising at least 80 mol-% carbon atoms, a base having a part, at least the part of the base comprising carbon atoms and optionally also oxygen atoms in such a way that the molar ratio of oxygen to carbon has a base value that is equal to or greater than zero, a first area comprising carbon atoms and oxygen atoms in such a way that the molar ratio of oxygen to carbon has a first value that is greater than the base value, and a second area comprising carbon atoms and oxygen atoms in such a way that the molar ratio of oxygen to carbon has a second value that is greater than the base value and different from the first value.

DETAILED DESCRIPTION

Figure 1A:
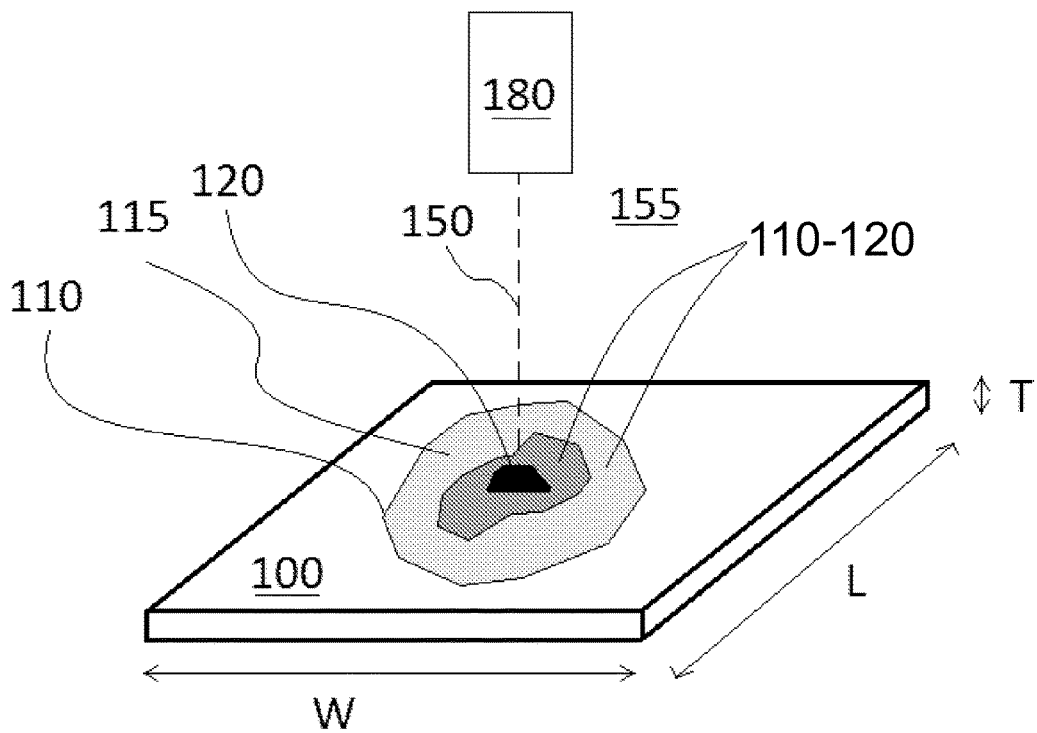
FIG. 1a shows locally exposing a first area of a piece of carbon nanomaterial to light.

Carbon nanomaterials are known to conduct heat and electricity very well because of exceptionally high carrier mobility. Thus, carbon nanomaterials are often seen as one of the best candidates for future electronics. To make functional devices from carbon nanomaterial, such as graphene, areas with different properties, such as electrical, mechanical, and/or optical properties, must be patterned onto the nanomaterial. In particular, to make functional electronic devices from carbon nanomaterial, such as graphene, areas with different electrical properties must be patterned onto the nanomaterial. These properties may be e.g.

an electrical property, such as electrical conductivity or band gap, an optical property, such as luminescence, transmittance or reflectivity, or a mechanical property, such as elastic modulus or brittleness (often measured in terms of tensile strain at break).

It has been found that some of these properties are affected by the degree of oxidation of the carbon material. The term "oxidation" refers to the reaction, wherein at least some of the carbon atoms of the carbon material react with oxygen in such a way that at least some of the oxidized carbon atoms still remain bonded with the other carbon atoms of the piece of carbon material. The degree of oxidation refers to the molar ratio of oxygen atoms to carbon atoms, later denoted by $N_O/N_C$. However, during oxidation, at least some carbon atoms may be removed from the piece of carbon nanomaterial. E.g. the material may be locally burned, whereby some carbon atoms of the carbon nanomaterial form gaseous carbon oxides, e.g. carbon monoxide (CO) or carbon dioxide ($CO_2$).

It has been found that carbon nanomaterials can be locally patterned by means of oxidation induced by electromagnetic radiation. This means that oxidation is induced locally at an area that is exposed to said electromagnetic radiation in an environment comprising oxygen. Moreover, it has been found that the degree of oxidation can be controlled by controlling at least one of (i) the properties of the radiation used for oxidation, (ii) the exposure time, and/or (iii) the oxygen content of the environment. As the level of oxidation is affected locally, also the other properties that depend thereon, are affected locally.

The light-induced oxidation may be due to two-photon or multiphoton induced oxidation. The light-induced oxidation may be due to two-photon or multiphoton induced oxidation, wherein the photons are from the visible or near infrared wavelength region (i.e. from 400 nm to 1100 nm). The light-induced oxidation may be due to two-photon or multiphoton induced oxidation, wherein the photons are from the visible wavelength region (i.e. from 400 nm to 700 nm). The light-induced oxidation may be due to two-photon or multiphoton induced oxidation, wherein the photons are from the near infrared wavelength region (i.e. from 700 nm to 1100 nm). In addition or alternatively, the light-induced oxidation may be due to single-photon induced oxidation. The light-induced oxidation may be due to single-photon induced oxidation, wherein the photon is from the ultra violet wavelength region (i.e. from 250 nm to 400 nm). Other values of the different parameters will be discussed later.

In general, photosensitive materials have been known for a long time. In the electronics manufacturing technology photosensitive materials are commonly used together with various passive masks, wherein the passive mask comprises areas that are transparent and other areas that are opaque, and the transparency of these areas cannot be actively controlled, e.g. by electrical means. By exposing the photosensitive material through the passive mask, an image can be patterned on e.g. a preform of a printed circuit board. After exposure, some exposed material may be e.g. washed away while the unexposed material remains on the preform (or vice versa). However, the sensitivity of carbon nanomaterials to light has not been known, or at least has not been utilized in the manufacture of electronic devices.

Manufacturing such a passive mask is very expensive. Moreover the cost increases as the line width of the passive mask decreases. Thus, passive masks for future electronics with small line widths will be very expensive. In various embodiments of the method, a passive mask can totally be omitted. This is because the required intensities, in particular for two-photon or multiphoton oxidation, are high, whereby a laser is preferably used to generate light. A laser produces a collimated beam, optionally a beam comprising at least one pulse. Therefore, laser light can be used to only locally expose the carbon nanomaterial even without a passive mask.

With reference to FIG. 1a, a piece of carbon nanomaterial 100 can be locally oxidized, i.e. patterned. The piece of carbon nanomaterial 100 has a length L, a width W, and a thickness T, such that the length L is greater than or equal to the thickness T, the width W is greater than or equal to the thickness T. Each of the directions of length L, width W, and thickness T are perpendicular to the other two directions. As for the term "nanomaterial", the thickness is at most 50 nm. The thickness may be at most 10 nm or at most 5 nm.

The term "carbon nanomaterial" may also refer to an object that is obtainable, by bending or rolling, from a sample of carbon nanomaterial having a length L, a width W, and a thickness T. Also here the length L is greater than or equal to the thickness T, the width W is greater than or equal to the thickness T. Each of the directions of length L, width W, and thickness T are perpendicular to the other two directions. As for the term "nanomaterial", the thickness of the sample of carbon nanomaterial, from which the piece of carbon nanomaterial is obtainable, is at most 50 nm. The thickness T of the sample of carbon nanomaterial, used to form the piece of carbon nanomaterial 100, may alternatively be e.g. at most 10 nm or at most 5 nm.

The small thickness is in many ways beneficial in particular for future electronics devices. Thin carbon nanomaterials are very flexible, whereby the shape of the material can be easily deformed e.g. by bending or rolling. Moreover, the thin carbon nanomaterial may be practically transparent, whereby electronic devices invisible to the naked eye can be manufactured. It has been observed, that by selecting the process parameters appropriately (see below), the light-induced oxidation can be used also for practically transparent carbon nanomaterials. Naturally, the transparency of the carbon nanomaterial can be slightly less than one, since the light interacts with the carbon nanomaterial. The transparency of a piece of carbon nanomaterial 100, for the visible wavelength range (from 400 nm to 700 nm) can be e.g. at least 75% or at least 90%.

The piece of carbon nanomaterial 100 comprises a region 110, wherein the region comprises at least 80 mol-% carbon atoms. The region 110 may comprise at least 90 mol-% carbon atoms or at least 95 mol-% carbon atoms. Moreover, initially the piece of carbon nanomaterial 100 may have uniform properties. Thus, the piece of carbon nanomaterial 100 may comprise at least 80 mol-% carbon atoms, at least 90 mol-% carbon atoms or at least 95 mol-% carbon atoms. The region 110 may have the same size as the piece of carbon nanomaterial 100, or it may be smaller.

Initially, the region 110 may be un-oxidized or oxidized to some degree. Therefore, in the region 110, the molar ratio of oxygen to carbon has a base value that is equal to or greater than zero. This molar ratio in the region 110 is defined as $N_O/N_C$, wherein $N_O$ is the number of oxygen atoms in the region 110 (optionally zero) and $N_C$ is the number of carbon atoms in the region 110 (greater than zero). The base value is thus the ratio $N_O/N_C$ in the region 110; this will be denoted by $N_O/N_C|_{100}$.

With the method, a first area 120 will be oxidized. The region 110 comprises the first area 120. The first area 120 is smaller than the region 110. Thereby the region 110 and the first area 120 define a base 115 that is comprised by the difference of the region 110 and the first area 120. The difference of the region 110 and the first area 120 is the set of points of the region 110 that are not comprised by the first area 120. In the set theory this is often denoted by the sign "-". The difference of the region 110 and the first area 120 can thus be denoted e.g. by "110-120". The difference of the region and the first area, 110-120, is a non-empty set, because the first area 120 is smaller than the region 110. The base 115 is comprised by this difference; see FIG. 1a.

The method, i.e. a first embodiment of the method, comprises generating a first light pulse sequence 150 with first light pulse sequence property values, the first light pulse sequence 150 comprising at least one light pulse.

The first light pulse sequence property values include e.g. intensity, wavelength, duration, and number of light pulses in the first sequence of light pulses.

The method further comprises exposing the first area 120 to said first light pulse sequence 150 in a first process environment 155 having a first oxygen content.

The method relates to patterning the carbon nanomaterial, the patterning being inherently a local process, whereby not all of the piece of carbon nanomaterial 100 is treated by the method. Thus, the method comprises exposing the first area 120 to said first light pulse sequence 150 without exposing at least part of the base 115 to said first light pulse sequence 150.

It has been observed, that by the presence of oxygen, light-induced oxidation takes place in the first area 120, but not in the base 115. By said exposing, and because the first process environment has the first oxygen content, the method comprises oxidizing locally, in the first area 120, at least some carbon atoms of the piece of carbon nanomaterial 100.

It has furthermore been observed, that if the intensity of light is exceptionally high, some of the carbon nanomaterial can be removed from the piece of carbon nanomaterial 100. However, to make a functioning device from carbon nanomaterial, only minor amounts of carbon, if any, should be removed by said exposing. Therefore the method comprises oxidizing locally, in the first area 120, at least some carbon atoms of the piece of carbon nanomaterial 100 in such a way that at most 10% of the carbon atoms of the first area 120 are removed from the first area 120.

Moreover, as the light-induced oxidation takes place in the first area 120, after said exposing the first area 120 to said first light pulse sequence 150, in the first area 120, the molar ratio of oxygen to carbon atoms has a first value, wherein the first value is greater than the base value. The first area 120 comprises a number $N_O|_{120}$ of oxygen atoms and a number $N_C|_{120}$ of carbon atoms. The molar ratio of oxygen to carbon atoms, $(N_O|_{120})/(N_C|_{120})$, in the first area 120, will be denoted by $N_O/N_C|_{120}$. Since oxidation has taken place, $N_O/N_C|_{120} > N_O/N_C|_{110}$.

Because at least a part of the base 115 is not exposed, the base comprises a part, wherein the level of oxidation of the part of the base 115 is not affected. Since in this way oxidation occurs only locally, the method comprises patterning the first area 120 of the piece of carbon nanomaterial 110.

It has been found that the method is suitable for patterning e.g. graphene. Within this description, the term "graphene" is used for planar, bent or rolled graphene sample; however, a graphene sample that is rolled to form a closed tube is called a nanotube. The carbon nanotube is either open or closed from its ends; however the surface of the nanotube is closed. In contrast, a carbon nanoscroll is a rolled graphene sample with a spiral (open) cross section. In contrast to nanotubes, the term "graphene" may refer to planar, bent, or rolled open graphene sample.

In particular the piece of carbon nanomaterial 100 may comprise, or preferably consist of a monolayer of graphene, e.g. planar or bent, and optionally at most partly oxidized, or multilayer graphene, e.g. planar or bent, comprising a number of graphene monolayers, wherein the number is at most 30, optionally chemically treated on at least a surface.

It has also been found that the degree of light-induced oxidation depends on the parameters used for oxidation. Moreover, it has been found that it is possible to pattern a second area 130 of the same piece of carbon nanomaterial 100 in such a way that the in the second area 130, the molar ratio of oxygen to carbon atoms has a second value $N_O/N_C|_{130}$, the second value being greater than the base value, i.e. $N_O/N_C|_{130} > N_O/N_C|_{110}$, and different from the first value, i.e. $N_O/N_C|_{130} \neq N_O/N_C|_{112}$.

A second embodiment of the method comprises all the steps of the first embodiment. In particular, since the first embodiment comprises exposing the first area 120, the first (and the second) embodiments comprise using a first set of values of process parameters to oxidize the first area 120, wherein the first set of values of process parameters comprises the first light pulse sequence property values and the first oxygen content.

The first set of values of process parameters may comprise e.g. the value of the intensity, the value of the wavelength(s), the value of the duration, and value of the number of light pulses in the first sequence of light pulses 150; in addition to the value of the first oxygen content of the first process environment 155.

Figure 1B:
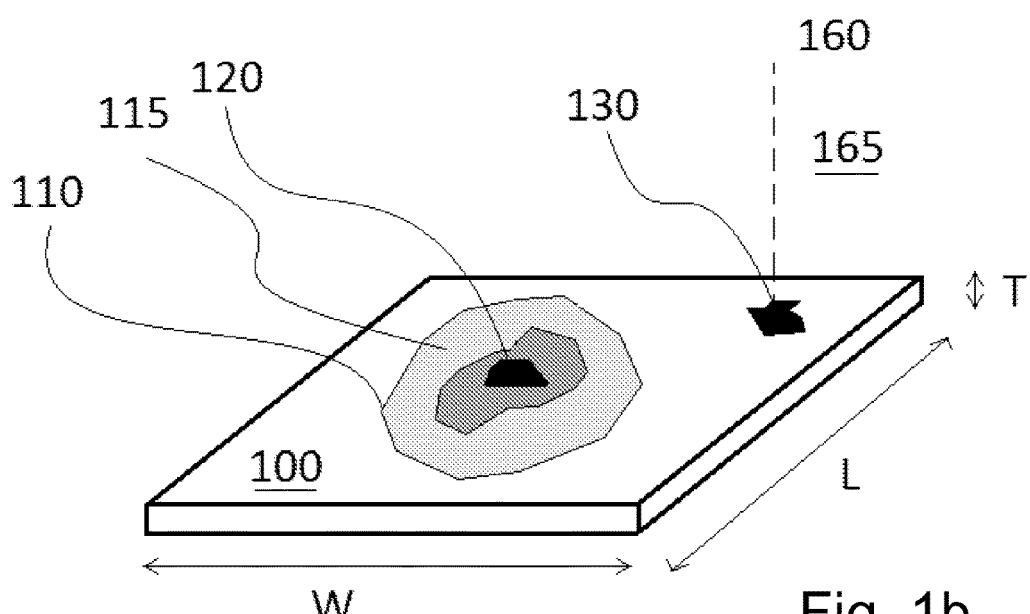
FIG. 1b shows locally exposing a second area of a piece of carbon nanomaterial to light after the first area has been exposed and oxidized.

With reference to FIG. 1b, the piece of carbon nanomaterial 100 further comprises a second area 130. As will be discussed, in a second embodiment, the second area 130 is exposed to a second light pulse sequence 160. The first area 120 is also shown in FIG. 1b. The second area 130 may be comprised by the first area 120. The second area 130 does not comprise the whole base 115, which base 115 is not exposed to the first light pulse sequence 150 by the first embodiment of the method. In other words, the difference of the second area 130 and the base 115 is a non-empty set. Thus at least a part of the base 115 remains unexposed (to both the light pulse sequences 150 and 160) also in the second embodiment.

The second embodiment comprises changing at least one value of a process parameter of the first set of values of process parameters thereby generating a second set of values of process parameters, wherein at least a value of a process parameter in the first set of values of process parameters is different from the value of the process parameter in the second set of values of process parameters.

Thus, the second embodiment may comprise changing, when changing the light pulse sequence that exposes the piece of carbon nanomaterial, i.e. the exposing light pulse, from the first sequence 150 to the second sequence 160, at least one of the intensity of light of a light pulse of the exposing light pulse sequence (150, 160), the duration of a light pulse of the exposing light pulse sequence (150, 160), the number of light pulses in the exposing light pulse sequence (150, 160), the exposure time used for exposing the area (120, 130), the repetition rate of the light pulses in the light pulse sequence (150, 160), the oxygen content of the environment wherein the carbon nanomaterial is oxidized, or the environment.

The second embodiment further comprises generating a second light pulse sequence 160 with second light pulse sequence property values, the second light pulse sequence property values comprised by the second set of values of process parameters, the second light pulse sequence 160 comprising at least one light pulse.

The second embodiment further comprises exposing the second area 130 to said second light pulse sequence 160 in (a) the process environment 155 having a second oxygen content or (b) another process environment 165 having a second oxygen content, the second oxygen content comprised by the second set of values of process parameters.

For example, if the first exposure is made in a second, different, environment 165, the second exposure can be made in the second environment 165 having a different oxygen content. The piece of carbon nanomaterial 100 can be moved from the first environment 155 to the second environment 165. However, the oxygen contents of the first and the second environments may be constants in time.

Alternatively, the same environment (i.e. location) can be used for both exposures, in such a way that the oxygen content is changed in between the first exposure and the second exposure. Alternatively, the same environment can be used for both exposures, in such a way that the oxygen content is not changed in between the first exposure and the second exposure; instead light pulse sequences 150, 160 with at least one different property are used.

In particular, the second embodiment comprises exposing the second area 130 to said second light pulse sequence 160 without exposing at least part of the part the base 115 that has not been exposed to the first light pulse sequence 150 to said second light pulse sequence 160. Thus, at least part of the base 115 is not exposed to either the first light pulse sequence 150 or the second light pulse sequence 160.

As at least one value of a process parameter is changed, at least a value of the process parameter used to expose the second area 130 to the second light pulse sequence 160 is different from the value of the corresponding process parameter used to expose the first area 120 to the first light pulse sequence 150, whereby the second area 130 is oxidized in a different way than the first area 120. Moreover at least a part of the base 115 is not oxidized or not further oxidized. Thus, the method comprises oxidizing locally, in the second area 130, at least some carbon atoms of the piece of carbon nanomaterial 100.

Also in the second embodiment, only a little material, if any, is removed by said exposing. Thus, the second embodiment comprises oxidizing locally, in the second area 130, at least some carbon atoms of the piece of carbon nanomaterial 100 in such a way that at most 10% of the carbon atoms of the second area 130 are removed from the second area 130.

Because the second area 130 is oxidized, after said exposing the second area 130 to said second light pulse sequence 160, in the second area 130, the molar ratio of oxygen to carbon atoms has a second value $N_O/N_C|_{130}$, the second value being greater than the base value, i.e. $N_O/N_C|_{130} > N_O/N_C|_{110}$.

Because the second area 130 is oxidized using different process parameters for the light-induced oxidation than for the light-induced oxidation of the first area 120, after said exposing the second area 130 to said second light pulse sequence 160, in the second area 130, the molar ratio of oxygen to carbon atoms has a second value $N_O/N_C|_{130}$, the second value being different from the first value, i.e. $N_O/N_C|_{130} \ne N_O/N_C|_{120}$.

As discussed, the oxidation affects e.g. the electrical properties of the piece of carbon nanomaterial 100 locally. An example of such an electrical property is the (local) band gap of the material. Band gap, in general, is small for electrical conductors, and large for electrical insulators.

In an embodiment of the method, the piece of carbon nanomaterial 100 is initially not oxidized. Thus, also after processing, at least part of the base 115 is an electric conductor. Therefore, in this embodiment, the band gap of at least that part of the base 115 is at most 0.01 eV, such as zero eV. In a corresponding way, in the processed piece of nanomaterial 400, obtained by processing the piece of carbon nanomaterial 100, the band gap of the part of the base is at most 0.01 eV, such as zero eV. In a preferred embodiment, the piece of carbon nanomaterial comprises graphene and the band bap of the unprocessed part of the base 115 is within these values.

As a comparative example, the band gap of reduced graphene oxide (RGO) may be in the range from 0.02 eV to 2 eV. Therefore, such a processed piece of carbon nanomaterial 400 suits electronics much better than a piece consisting of RGO or made from RGO. In a similar way, by applying the method to a piece of carbon nanomaterial having a base with band gap less than 0.02 eV will produce a processed piece of carbon nanomaterial 400 that is superior for purposes of electronics, as compared to devices based on RGO. Correspondingly, the part of the base 115 of the processed piece 400 could have a band gap less than 0.02 eV.

The piece of carbon nanomaterial 100 may have initially been oxidized to some extent. Thus, the band gap of the base 115 may be also greater than 0.01 eV. According to the first embodiment of the method, the conductivity of the first area 120 of the piece of nanomaterial 100 is decreased by said oxidation. Thus, in an embodiment, the first area 120 is oxidized in such a way that the band gap of the first area 120 is more than the bang gap of the aforementioned conductive part of the base 115. More specifically, in an embodiment, the base 115 has a base band gap, the first area 120 is oxidized in such a way that the band gap in the first area 120 has a first band gap value, wherein the first band gap value is more than the base band gap and the second area 130 is oxidized in such a way that the band gap in the second area 130 has a value that is more than the first band gap value.

In addition, to make the first area 120 semiconducting (i.e. not well conducting or well insulating), the first area 120 may be oxidized in such a way that the band gap of the first area 120 is more than 0.05 eV, such as at least 0.1 eV. Still further, to make the first area 120 semiconducting, the first area 120 may be oxidized in such a way that the band gap of the first area 120 is less than 3 eV, such as at most 2 eV.

Thus, in a corresponding processed piece of carbon nanomaterial 400, the first area 120 of a processed piece of carbon nanomaterial 400 is (or has been) oxidized in such a way that the band gap of the first area 120 is more than the bang gap of the part of the base 115, optionally less than 3 eV and/or more than 0.05 eV, such as at least 0.1 eV, optionally less than 3 eV.

According to the second embodiment of the method, the conductivity of the second area 130 of the piece of nanomaterial 100 is decreased by said oxidation. The first and second areas 120, 130 can be ordered (named) in such a way that the second area 130 is oxidized more than the first area 120. The second area 130 can be oxidized e.g. to form an electrically insulating area. Thus, in an embodiment, the second area 130 is oxidized in such a way that the band gap of the second area 130 is more than the bang gap of the first area 120, and/or
at least 3 eV.

Thus, in an embodiment, the second area 130 of a processed piece of carbon nanomaterial 400 is (or has been) oxidized in such a way that the band gap of the second area 130 is more than the bang gap of the first area 120, and/or
at least 3 eV.

As discussed above, preferably laser light source(s) is/are used to generate a light pulse sequence (150 or 160) or the light pulse sequences 150 and 160. Thus, in an embodiment, the first light pulse sequence 150 is generated using a first laser light source. The laser light source may be the light source 330 (see FIG. 3b) or the light source 180 (see FIG. 3a).

Figure 3A:
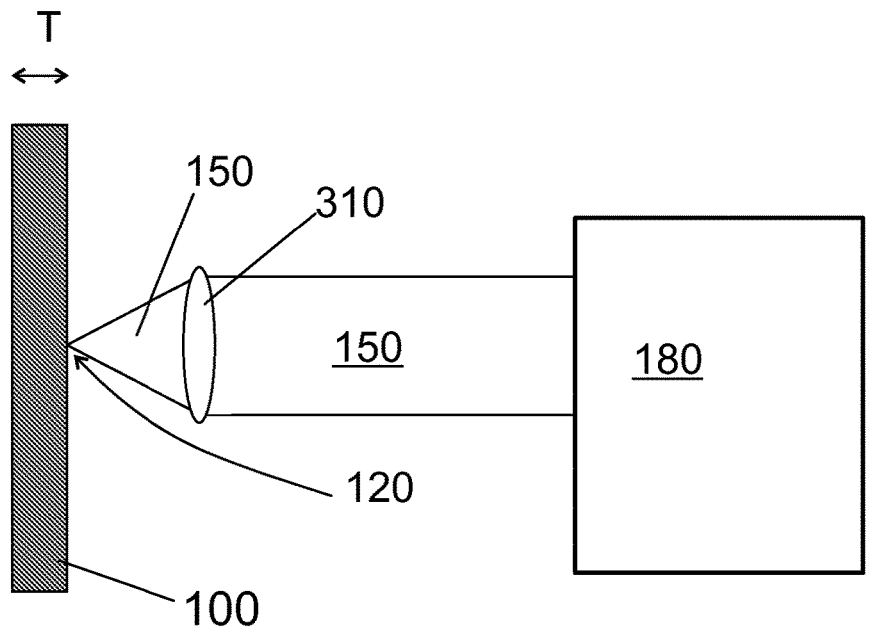
FIG. 3a shows a way of locally exposing a part of a piece of carbon nanomaterial to light.
Figure 3B:
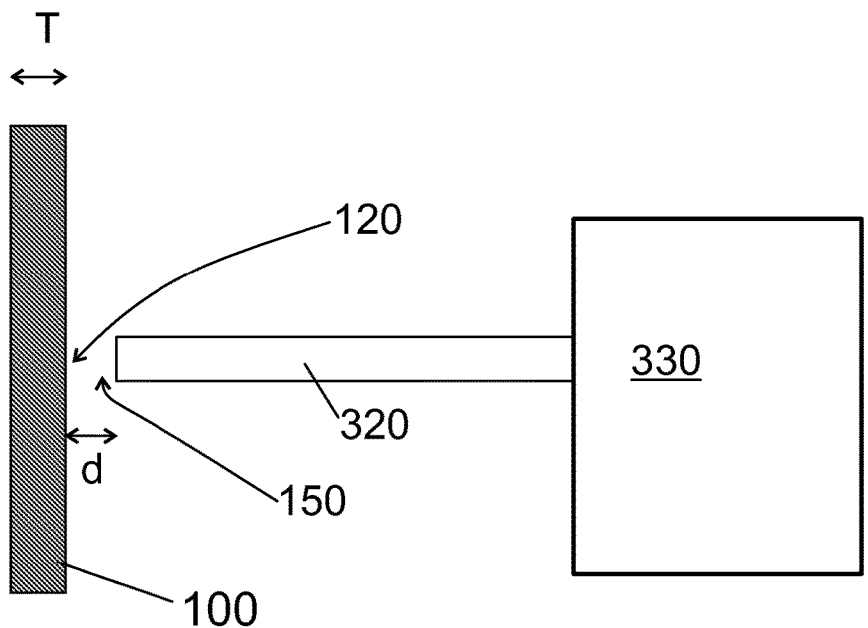
FIG. 3b shows a way of locally exposing a part of a piece of carbon nanomaterial to light.

In an embodiment, wherein also the second light pulse sequence 160 is generated, the second light pulse sequence 160 is generated using a laser light source, such the first laser light source or another laser light source (see FIGS. 3a and 3b).

The first (and optionally the other) laser light source is arranged to produce a light pulse sequence 150 (optionally also 160). Thus, preferably a pulse laser is used as the light source for generating a light pulse sequence (150, 160). The pulse laser light source is arranged to generate laser light pulses having a duration. The duration is preferably in the range of from 1 fs to 1 ps, such as from 10 fs to 200 fs, such as from 20 fs to 60 fs. This duration has been observed to provide good control of intensity and exposure time in view of oxidation. The number of light pulses in a light pulse sequence (150, 160) may be e.g. in the order of $10^6$.

As discussed above, and with reference to FIGS. 3a and 3b, when a laser light source is used, a mask is not required. Thus, in an embodiment, the first light pulse sequence 150 is conveyed from the first laser light source (180, 330) onto the first area 120 without penetrating a passive mask that comprises areas that are transparent and other areas that are opaque.

In particular, in this embodiment, the first light pulse sequence 150 is not attenuated or blocked by an opaque area of the passive mask. Thus the first light pulse sequence 150 is conveyed from the first laser light source (180, 330) onto the first area 120 without being at least partly blocked by an opaque area of a passive mask, through which the first light pulse sequence 150 is arranged to run.

As for the term passive mask, the local transparency of the passive mask, i.e. the transparency of the transparent and opaque areas of the passive mask, cannot be electrically controlled.

In an embodiment, the second light pulse sequence 160 is conveyed from the first laser light source (180, 330) or another laser light source onto the second area 130 without penetrating a passive mask that comprises areas that are transparent and other areas that are opaque. For example, without being at least partly blocked by an opaque area of a passive mask, through which the second light pulse sequence 160 is arranged to run.

Naturally, a passive mask could be used for patterning. In a corresponding embodiment, at least part of the first light pulse sequence 150 is arranged to run through a passive mask, such that at least part of the first light pulse sequence 150 is blocked by an opaque area of the passive mask.

It has been found that the degree of oxidation affects in particular the electrical conductivity of the piece of carbon nanomaterial 100. The electrical conductivity, on the other hand, can be locally engineered to form a functional electronic device. For example, in a third embodiment, wherein the steps of the first embodiment are performed, the base 115 has a base electrical conductivity and
the first area 120 is oxidized in such a way that the electrical conductivity of the first area 120 is less than the base electrical conductivity.

For example, the base 115 can form a conductor and the first area 120 can form a semiconductor. The conductivity of semiconductors can be affected e.g. by an electric field.

In a corresponding way, in an embodiment, the base 115 has a base band gap and
the first area 120 is oxidized in such a way that the band gap in the first area 120 is more than the base band gap.

Moreover, in a fourth embodiment, wherein the steps of the second embodiment are performed, the base 115 has a base electrical conductivity
the first area 120 is oxidized in such a way that the electrical conductivity of the first area 120 has a first electrical conductivity, wherein
the first electrical conductivity is less than the base electrical conductivity and
the second area 130 is oxidized in such a way that the electrical conductivity of the second area 130 is less than the first electrical conductivity.

Several types of carbon nanomaterials can be patterned with various embodiments of the method.

Figure 2A:
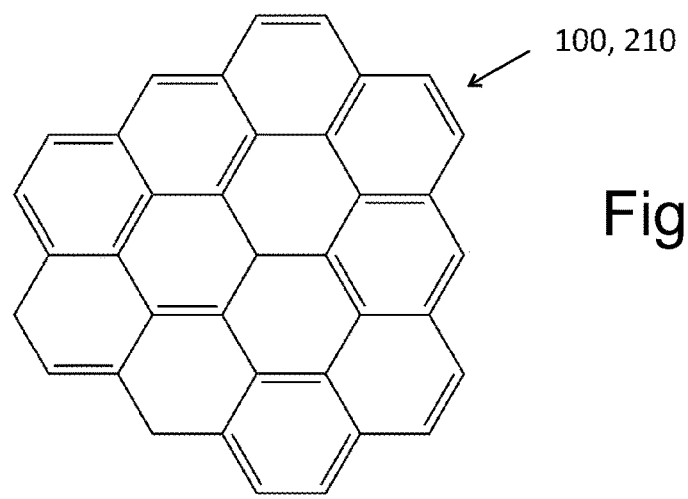
FIG. 2a shows an example of a graphene monolayer as seen from top.
Figure 2B:
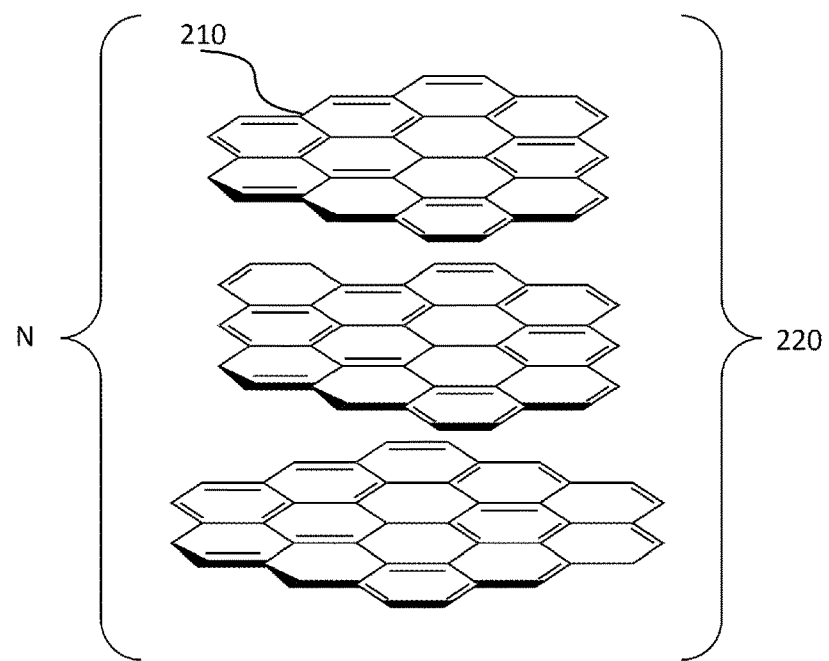
FIG. 2b shows an example of multilayer graphene in an exploded perspective view.
Figure 2C:
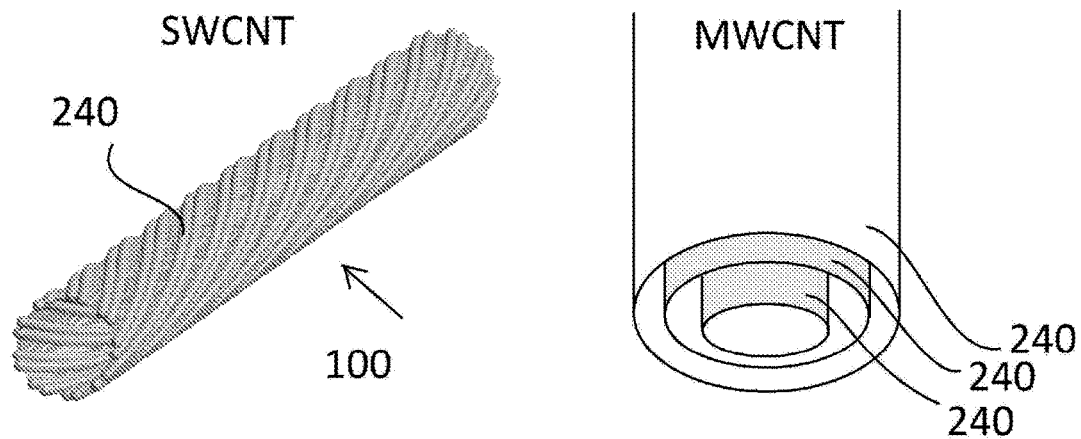
FIG. 2c shows examples of carbon nanotubes.
Figure 2D:
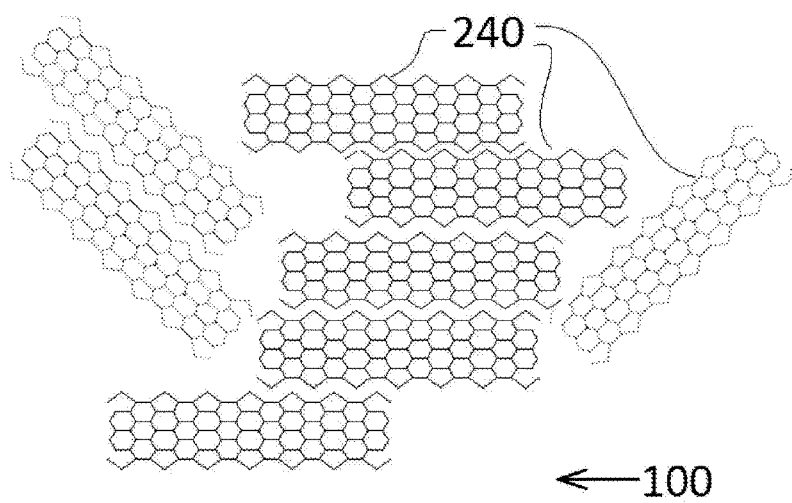
FIG. 2d shows an example of a network of carbon nanotubes.

FIGS. 2a to 2c show examples of pieces of carbon nanomaterials. A piece of carbon nanomaterial 100 may comprise a monolayer of graphene 210 (FIG. 2a),
multiple layers of graphene (FIG. 2b), i.e. multilayer graphene 220 comprising a number N of graphene monolayers 210, preferably at most 30 graphene monolayers,
a carbon nanotube 240 (FIG. 2c), such as a single wall carbon nanotube (SWCNT)
another carbon nanotube 240 (FIG. 2c), such as a multi wall carbon nanotube (MWCNT), and/or
a net of carbon nanotubes 240 attached to each other (FIG. 2d). The nanotubes may be attached from their ends or otherwise.

FIG. 2a shows a graphene monolayer 210, which is an example of a piece of carbon nanomaterial 100. Graphene is a two-dimensional material consisting of hexagonal aromatic carbon network. It is ultrathin having a thickness of minimally only one atomic layer and it has excellent electronic properties making it a potential material to be used in flexible, transparent thin electronic devices. The graphene layer may be supported on a support, such as a polymer support or a glass support. It may also be supported only from its boundaries e.g. by a metal support. Such a graphene layer may be also oxidized to some degree, i.e. some of the atoms of the lattice may form a bond with an oxygen atom.

FIG. 2b shows a multilayer graphene 220, i.e. a thin piece comprising several (i.e. N) graphene monolayers 210, such as at most 30 monolayers. In FIG. 2b, the number N is three. The piece of carbon nanomaterial 100, i.e. the multilayer graphene 220, may be supported on a support, such as a polymer support or a glass support. It may also be supported only from its boundaries e.g. by a metal support. Such a piece of carbon nanomaterial may be also oxidized to some degree, i.e. some of the carbon atoms may form a bond with an oxygen atom.

FIG. 2c shows a carbon nanotube 240, another example of a piece of carbon nanomaterial 100. Carbon nanotubes (CNT) can be considered as tubes formed from rolled graphene. CNTs can be either single walled (SWCNT) or multiwalled (MWCNT). CNTs can be either metallic or semiconducting depending on how the graphene sheet is rolled into a tube. A carbon nanotube has a diameter, which equals to both the width and the thickness of the piece of carbon nanomaterial 100. The length of a carbon nanotube is typically many times the diameter. The carbon nanotube 240 may be a single wall nanotube (SWCNT) or a multi wall nanotube (MWCNT), as illustrated in FIG. 2c.

Thin films can be made from CNTs where a network of CNTs form a thin layer of interconnected tubes. CNT films can be used as (semi)transparent materials in electronic and sensor applications. FIG. 2d shows a network of carbon nanotubes 240, another example of a piece of carbon nanomaterial 100. The carbon nanotubes 240 may comprise single wall nanotubes (SWCNT) and/or multi wall nanotubes (MWCNT). The nanotubes are attached to each other. The nanotubes may be attached to each other from their ends or otherwise.

The method for patterning carbon nanomaterial, both the first embodiment and the second embodiment, is suitable for patterning these types of carbon nanomaterials. Thus, in an embodiment the piece of carbon nanomaterial 100 comprises
- a monolayer of graphene or multilayer graphene comprising a number of graphene monolayers, such as at most 30 monolayers,
- a carbon nanotube, such as a single wall carbon nanotube (SWCNT) or a multi wall carbon nanotube (MWCNT), and/or
- a net of carbon nanotubes attached to each other e.g. from their ends.

Moreover, the first and the second embodiment, in particular the first embodiment, is particularly suitable for processing carbon nanomaterial comprising graphene. Thus, in an embodiment the piece carbon nanomaterial 100 comprises, preferably consists of,
- a monolayer of graphene 210,
- a monolayer of at least part oxidized graphene,
- multilayer graphene 220 comprising a number of graphene monolayers 210, wherein the number is at most 30,
- surface treated multilayer graphene comprising a number of graphene monolayers, wherein the number is at most 30, having been treated chemically from at least one surface,
- multilayer graphene 220 comprising a number of graphene monolayers 210, wherein the number is at most 10, and
- surface treated multilayer graphene comprising a number of graphene monolayers, wherein the number is at most 10, having been treated chemically from at least one surface.

Furthermore, the piece of carbon nanomaterial can be supported on a support, optionally from only its boundaries. The support may comprise e.g. less than 80 mol-% carbon atoms.

The first light pulse sequence 150 comprises a light pulse. The light pulses of the first light pulse sequence 150 are preferably generated using at least one laser. Also, further lasers can be used to increase the intensity and/or to apply many different wavelengths to the first area 120. This applies as well to the second light pulse sequence 160 used in the second embodiment to expose the second area 130.

As for the wavelength, in the first or the second embodiment, the properties of the first light pulse sequence 150 may be selected such that
- a light pulse of the first light pulse sequence 150 comprises photons having a wavelength from 250 nm to 1100 nm.

In the second embodiment, the properties of the second light pulse sequence 160 may be selected such that
- a light pulse of the second light pulse sequence 160 comprises photons having a wavelength from 250 nm to 1100 nm.

These wavelengths have been observed to effectively oxidize the piece of carbon nanomaterial 100.

As for the intensity of the light of the first light pulse sequence 150, in the first or the second embodiment,
- a light pulse of the first light pulse sequence 150 has an intensity from $10^9$ W/(cm)$^2$ to $10^{14}$ W/(cm)$^2$; such as from $10^{10}$ W/(cm)$^2$ to $10^{13}$ W/(cm)$^2$, e.g. from to $7 \times 10^{11}$ W/(cm)$^2$. $7 \times 10^{10}$ W/(cm)$^2$.

In the second embodiment,
- a light pulse of the second light pulse sequence 160 has an intensity from $10^9$ W/(cm)$^2$ to $10^{14}$ W/(cm)$^2$; such as from $10^{11}$ W/(cm)$^2$ to $10^{13}$ W/(cm)$^2$, e.g. from $7 \times 10^{10}$ W/(cm)$^2$ to $7 \times 10^{11}$ W/(cm)$^2$.

These values have been found to be sufficiently high for local oxidation. These values have been found to be sufficiently high for local oxidation using multiphoton oxidation. These values have been found to be sufficiently low for preventing excessive removal of carbon material from the first area 120, and optionally from the second area 130.

In particular, the intensity can be selected such that the intensity of all light pulses of the first light pulse sequence 150 are below an ablation threshold. The ablation threshold is herein defined as the minimum intensity required to induce separation of carbon atoms from the piece of carbon nanomaterial 100 due to incident intense irradiation. The separated carbon atoms may form gaseous carbon oxide, such as carbon monoxide (CO) or carbon dioxide ($CO_2$). This threshold may depend on the initial degree of oxidation, i.e. the base value $N_O/N_C|_{110}$ (see above) and/or on the oxygen content of the environment (i.e. the first or the second oxygen content).

Moreover, it has been observed that when the process involves multiphoton excitation, intensity needs to be carefully selected; on one hand to enable multiphoton excitation, and on the other hand to avoid ablation. Multiphoton excitation seems to be needed at least when visible or near infrared light (wavelength from 400 nm to 1100 nm) is used in the corresponding light pulse sequence (150, 160). The aforementioned intensities are suitable for multiphoton oxidation. Moreover, the aforementioned intensities may be suitable also for light pulses of different wavelengths.

As for the oxygen content of the first environment 155, wherein the piece of carbon nanomaterial is exposed to light, in the first or the second embodiment
- the first oxygen content is at least 0.4 mol/m$^3$.

In principle there is no upper limit for the oxygen content. If needed, the first oxygen content may be e.g. at most 100 mol/m$^3$, such as at most 40 mol/m$^3$.

In the second embodiment
- the second oxygen content is at least 0.4 mol/m$^3$.

The second oxygen content may be at e.g. most 100 mol/m$^3$, such as at most 40 mol/m$^3$.

Moreover, it seems that the oxidation rate is insensitive to oxygen content, when the oxygen content is more than about 10 mol/m$^3$.

These values have been found to be sufficiently high for local oxidation. These values have been found to be sufficiently low for preventing ignition of the piece of carbon nanomaterial, at least for some of the aforementioned intensities. In principle, the higher the oxygen content, the lower intensity and/or shorter exposure time may suffice.

As for the exposure time, it has been found that within the aforementioned intensity range, an exposure time between 10 ms and 10 s, such as from 100 ms to 5 s, such as from 0.5 s to 2 s, e.g. about 1 s, provides good oxidation results. A smaller exposure time can be used with higher intensity and vice versa.

The exposure time herein is defined as the time of exposing the area(s) (120, 130) to the light pulse sequence. More precisely, the difference of the instances when the last light pulse stops illuminating and when the first pulse starts illuminating. The proper exposure time may depend on a repetition rate of the light pulses of the light pulse sequence (150, 160).

The repetition rate for the light pulses of the light pulse sequence (150, 160) can be defined as the number of light pulses per unit time. Thus, the repetition rate is the inverse of the time difference between subsequent light pulses (in particular the time difference of the same part of the pulses). A repetition rate from 10 kHz to 10 MHz, such as from 100 kHz to 1 MHz, such as about 600 kHz was seen to provide good oxidation results.

The total illumination time, which is the product of (a) the number of light pulses in the pulse sequence (first sequence 150 or second sequence 160) during the exposure time and (b) the pulse duration, may be significantly less. E.g. for the exposure time 1 s, repetition rate 600 kHz, and pulse duration 40 fs, the total illumination time is only 24 ns.

With the aforementioned pulse duration and exposure time, the applicable number of light pulse may be in the range from $1\times10^3$ to $1\times10^7$, such as from $1\times10^4$ to $3\times10^6$, such as from $1\times10^5$ to $1\times10^6$, e.g. about $6\times10^5$.

Future electronic devices are likely to be small and to comprise multiple differently operating areas. Therefore, the method is preferably applied in such a way that the patterned area is small and/or it is accurately shaped. As the patterning is light-induced, the first light pulse sequence 150, when hitting the first area 120, i.e. the exposed area, preferably has a small size. The size of the exposed area can be controlled e.g. by using focusing optics or using near field optics. These can be used in the first embodiment or the second embodiment. Moreover, focusing can be used for the first area 120, and near field optics for the second area 130, or vice versa. Naturally focusing or near field optics can be used for both first 120 and second 130 areas.

FIG. 3a shows an example of using focusing optics 310 to collimate the light first light pulse sequence 150 onto the first area 120. Similar optics could be used to collimate the second light pulse sequence 160 onto the second area 130. The device of FIG. 3a comprises
- a light source 180 arranged to generate the first light pulse sequence 150. The light source 180 may be arranged to generate the second light pulse sequence 160. and
- and focusing optics 310 arranged to decrease the cross sectional area of a light pulse of the first light pulse sequence 150.

An embodiment of a corresponding method comprises focusing the first light pulse sequence 150 using focusing optics 310 to decrease the cross sectional area of a light pulse of the first light pulse sequence 150.

The focusing optics 310 may comprise a lens 310. In the alternative or in addition, a reflective surface can be used to focus the light pulse sequence (first or second). As is clear from FIG. 3a, the cross sectional area of a light pulse of the first light pulse sequence 150 decreases after passing the lens 310. The pattern size achievable using the device of FIG. 3a is limited by the wavelength of the light of the light pulse sequence. Thus, to produce areas with small line width, light of short wavelength should be used.

FIG. 3b shows an example of using near field optics to expose the first area 120 or the second area 130. FIG. 3b shows a light pulse source 330, arranged to generate the first light pulse sequence 150 and to guide the first light pulse sequence 150 into a waveguide 320. FIG. 3b shows also the waveguide 320, which is arranged close to the area (120, 130) of the piece of carbon nanomaterial 100 that is exposed to light.

In near field optics, the distance d between an end of the waveguide 320 and the exposed area (120, 130) is less than the wavelength of the light used. Thus, in an embodiment
- a light pulse sequence (i.e. the first light pulse sequence 150 or the second light pulse sequence 160) comprises a light pulse or light pulses having a longest wavelength.

The embodiment comprises
- using a waveguide 320 to guide a light pulse sequence (i.e. the first light pulse sequence 150 or the second light pulse sequence 160) from a light source 330 to an end of the waveguide, in such a way that
- the closest distance d between the end of the waveguide and the piece of carbon nanomaterial 100 is at most the longest wavelength.

In this way an area having a line width less than or equal to the wavelength of the light pulse of the first light pulse sequence can be patterned.

The longest wavelength may be e.g. 1100 nm, 700 nm, 300 nm, or 250 nm. Thus, the distanced may be e.g. at most 1100 nm, at most 700 nm, at most 300 nm, or at most 250 nm.

To control the patterning process, in particular the shape of the patterned first area 120, a passive mask could be used, as discussed above, but such a passive mask is preferably not used. Alternatively, the shape of the patterned first area 120 can be controlled by moving the beam. Still further, the shape of the patterned first area 120 can be controlled by the shape and/or intensity profile of the first light pulse sequence 150 and/or the second light pulse sequence 160.

During the illumination of the area (120, 130), the exposed area (i.e. the area that is illuminated by the a light pulse sequence 150, 160) can be moved with respect to the piece of carbon nanomaterial 100 in order to pattern oxidized patterns that extend within the carbon nanomaterial. E.g. the piece of carbon nanomaterial 100 can be moved with respect to fixed optics. E.g. the piece of carbon nanomaterial 100 can be fixed, and the exposed area can be moved by moving or turning the optics. The speed of the relative movement affects the exposure time. Thus, the first area 120 and second area 130 can be patterned in different ways also by varying the speed by which the illuminated area (120, 130) is arranged to move on the piece of carbon nanomaterial.

The shape and/or intensity profile of a light pulse sequence, such as the first 150 or the second 160, can also be controlled by a spatial light modulator (SLM). In this embodiment, the input laser beam is structured so that some spatial parts have of the light pulse sequence have higher intensity and other spatial parts have lower intensity. In this way, some parts of the piece of carbon nanomaterial are oxidized in a different way than other parts. In contrast to e.g. a lens, which also modifies the spatial profile of light, a spatial light modulator is an active component. A spatial light modulator can be electronically controlled.

Therefore, by using the spatial light modulator, a light pulse sequence be modified to comprise spatially two parts: a first light pulse sequence 150 and a second light pulse sequence 160. In this embodiment, the two light pulse sequences are simultaneously used to oxidize the first area 120 and the second area 130. Naturally, two different light sources could also be used to simultaneously oxidize the areas in different ways.

The spatial light modulator may comprise a polarizer and an electrically controllable liquid crystal unit. The liquid crystal unit is arranged to locally change the polarization of light propagating through the liquid crystal unit. The amount of change in the polarization can be controlled electrically and locally within the liquid crystal unit. In combination with the polarizer, the transparency of the spatial light modulator becomes spatially non-uniform, whereby the spatial light modulator can be used to pattern the piece of carbon nanomaterial. Moreover the spatial transparency of the spatial light modulator is electrically controllable. In this way, the spatial light modulator forms an active mask. In contrast to aforementioned passive mask, the local transparency of the active mask, i.e. the transparency of the transparent and opaque areas of the active mask, can be electrically controlled.

Thus, an embodiment comprises modifying the spatial profile of a light pulse sequence using an active spatial light modulator. As an example, an embodiment comprises modifying the spatial profile of a light pulse of a light pulse sequence using an active spatial light modulator. The active spatial light modulator may be electrically controllable. The local transparency of the active spatial light modulator may be electrically controllable.

Figure 4:
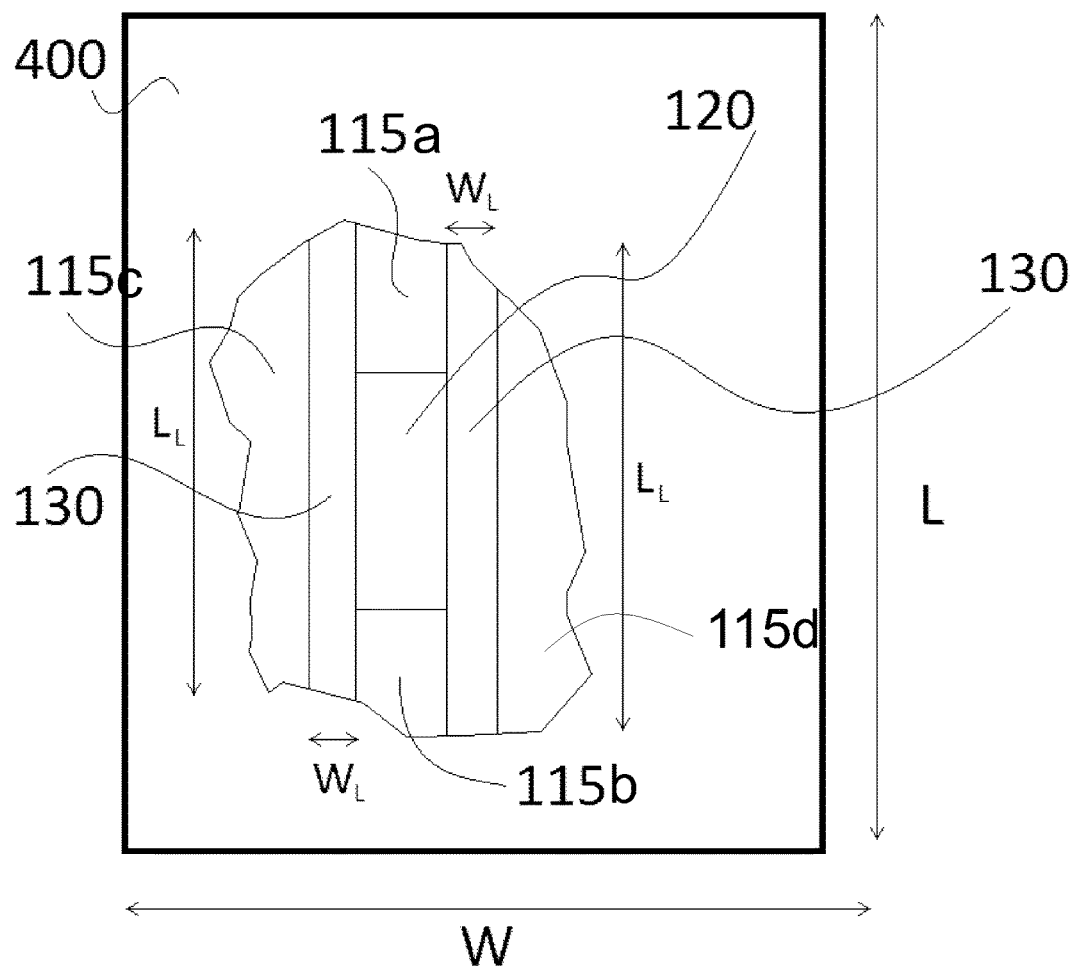
FIG. 4 shows a processed piece of carbon nanomaterial and different areas therein.

After the piece of carbon nanomaterial 100 has been processed, a processed piece of carbon nanomaterial 400 is obtained. With reference to FIG. 4, a processed piece of carbon nanomaterial 400 has
- a length L, a width W, and a thickness T, such that
- the length L is greater than or equal to the thickness T, the width W is greater than or equal to the thickness T,
- each of the directions of length L, width W, and thickness T are perpendicular to the other two directions.

In an embodiment,
the thickness is at most 50 nm.

However, in addition to the aforementioned oxidation process, the sample of carbon nanomaterial or the piece of carbon nanomaterial 100 can be processed, e.g. bent or rolled, so as to form a processed piece of carbon nanomaterial 400 having a larger thickness. Thus, in an embodiment, the processed piece of carbon nanomaterial 400 is obtainable, e.g. by bending or rolling, from a sample of carbon nanomaterial having a length, a width, and a thickness wherein the length is greater than or equal to the thickness, the width is greater than or equal to the thickness, and the thickness is at most 50 nm.

In an embodiment, the processed piece of carbon nanomaterial 400 is planar (i.e. not bent or rolled), wherein the processed piece of carbon nanomaterial has the measures described above.

The processed piece of carbon nanomaterial 400 comprises
- at least 80 mol-% carbon atoms,
- a base 115 having a part, at least the part of the base 115 comprising carbon atoms and oxygen atoms in such a way that the molar ratio of oxygen to carbon, $N_O/N_C$, has a base value $N_O/N_C|_{110}$ (cf. above, note this ratio is not affected by the method, as the part of the base is not exposed to light) that is equal to or greater than zero,
- a first area 120 comprising carbon atoms and oxygen atoms in such a way that the molar ratio of oxygen to carbon in the first area 120 has a first value $N_O/N_C|_{120}$ that is greater than the base value $N_O/N_C|_{110}$, and
- a second area 130 comprising carbon atoms and oxygen atoms in such a way that the molar ratio of oxygen to carbon in the second area 130 has a second value $N_O/N_C|_{130}$ that is greater than the base value $N_O/N_C|_{110}$ and different from the first value $N_O/N_C|_{120}$.

As the processed piece of carbon nanomaterial 400 is the result of processing the piece of carbon nanomaterial 100 by the second embodiment of the method, the processed piece of carbon nanomaterial 400 may comprise
- a monolayer of graphene or multilayer graphene comprising a number of graphene monolayers, such as at most 30 monolayers,
- a carbon nanotube, such as a single wall carbon nanotube (SWCNT) or a multi wall carbon nanotube (MWCNT), or
- a net of carbon nanotubes attached to each other e.g. from their ends.

In particular the processed piece of carbon nanomaterial 400 may comprise, or preferably consist of
- a non-rolled monolayer of graphene, optionally at least partly oxidized, or
- non-rolled multilayer graphene comprising a number of graphene monolayers, wherein the number is at most 30, optionally chemically treated on at least a surface.

The processed piece of carbon nanomaterial 400 may be arranged on a support, such as a glass support or a polymer support. The processed piece of carbon nanomaterial 400 may be arranged to a support only from its boundaries, such as attached to a metal support limiting an aperture, the processed piece of carbon nanomaterial 400 being arranged on the aperture. The support may comprise e.g. less than 80 mol-% carbon atoms.

When the areas are patterned using light-induced oxidation, reasonably small areas can be accurately patterned. In an embodiment,
- the first area 130 has a line width $W_L$, a line length $L_L$, and a line thickness $T_L$, the line thickness $T_L$ being parallel to the thickness T of the processed piece of carbon nanomaterial 400, the direction of the line width $W_L$ being perpendicular to the direction of the line length $L_L$ and perpendicular to the direction of the line thickness $T_L$, and the line width $W_L$ being at most the line length $L_L$, wherein
- the line width $W_L$ is adapted to be suitable for electronic devices.

Here the line thickness $T_L$ is parallel to the thickness of a layer of the processed piece of carbon nanomaterial 400. When the processed piece of carbon nanomaterial is planar or bent, the processed piece 400 comprises only one such layer. Thus, the line thickness $T_L$ is parallel to the thickness of the processed piece of carbon nanomaterial 400 and the layer of the processed piece of carbon nanomaterial 400. However, when the processed piece of carbon nanomaterial is rolled from a layer of nanomaterial, the line thickness $T_L$ is parallel to the thickness of the layer of the processed piece of carbon nanomaterial 400.

In an embodiment, the line width $W_L$ is at most 1 mm, such as at most 10 μm, at most 700 nm or at most 300 nm. The line width $W_L$ can be decreased by using the collimation optics or near field techniques as discussed above.

In a corresponding method, the piece of carbon nanomaterial 100 is processed in such a way that these measures are achieved.

The line length $L_L$ can be increased by moving the point, wherein the (first or second) light pulse sequence illuminates the piece of carbon nanomaterial.

As the processed piece of carbon nanomaterial 400 may have been made by light-induced oxidation that has removed some carbon atoms, in an embodiment, at least some carbon atoms has been removed from a processed area of the processed piece of carbon nanotube 400, whereby the first area 120 or the second area 130 comprises a groove.

Moreover, the molar ratio of oxygen to carbon, in the processed region (i.e. the first area 120 or the second area 130) comprising the groove, is higher than in the base 115.

The properties of the piece of nanomaterial 100 or the processed piece of material 400 can be analyzed e.g. by using four-wave mixing (FWM) microscopy. In this method, three laser fields with different frequencies interact through the nanomaterial's susceptibility to generate a signal at a fourth frequency. The four wavelengths can be chosen to all be in the visible range in such a way that the fourth wavelength can be optically separated from the other three. Thereafter, an optical microscope can be used to analyze the signal at the fourth wavelength. The FWM signal is sensitive in particular to electrical and vibrational properties of the nanomaterial. By tuning the incoming or emitted frequencies into an electronic resonance of the material, selected electronic excitations can be probed. In addition, electronically resonant excitation of the material is accompanied by an enhanced FWM response. In this way, the change in the electrical properties of the material, as obtained by the aforementioned embodiments, can be confirmed. An example of an application of the FWM is coherent anti-Stokes Raman scattering (CARS) imaging. Another example of the FWM method is stimulated Raman scattering (SRS).

Figure 5:
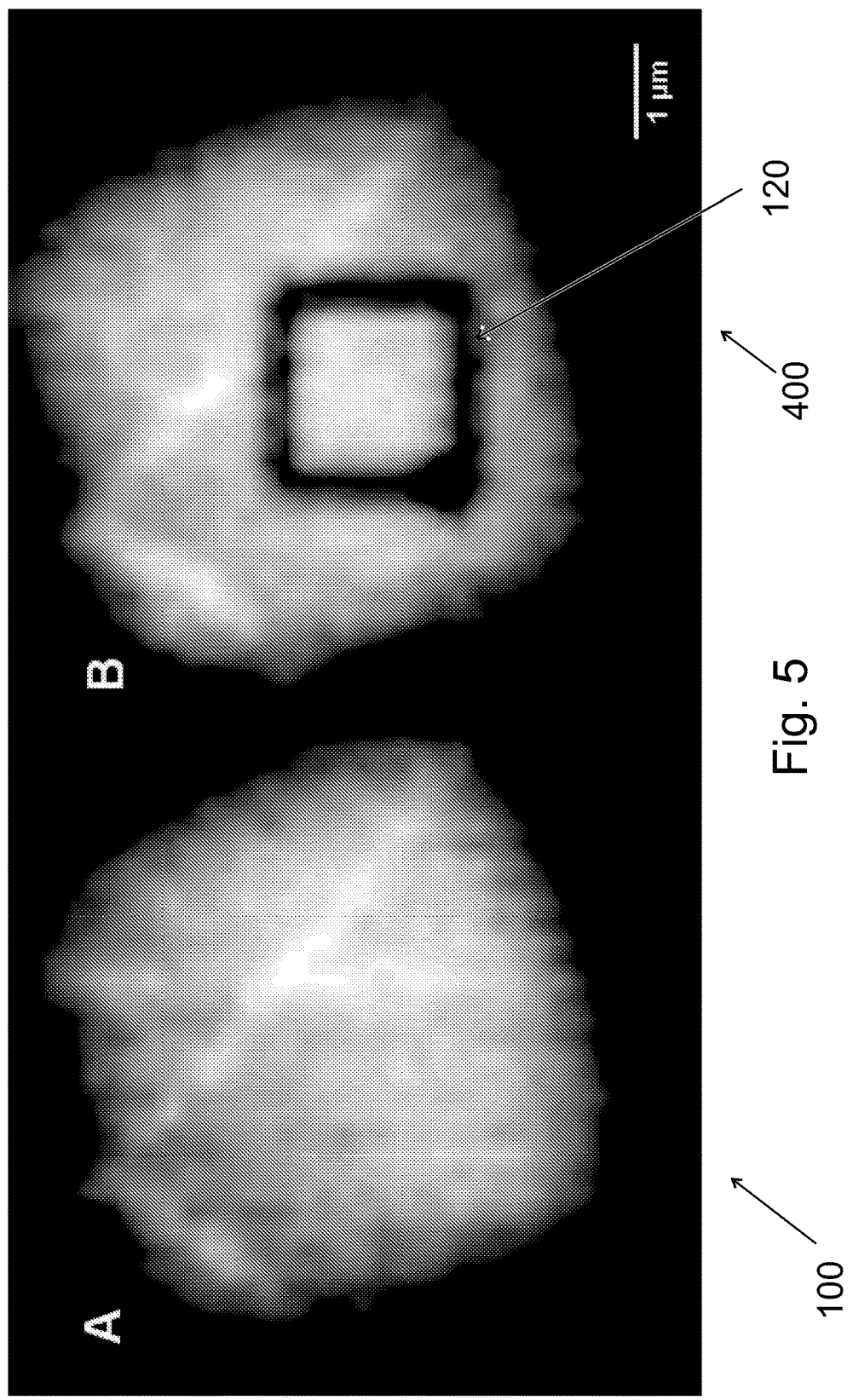
FIG. 5 shows a piece of carbon nanomaterial, as observed with four-wave mixing (FWM) microscopy, before (A) and after (B) patterning it with the presented method.

FIG. 5 shows the FWM signal obtained from a piece of carbon nanomaterial 100 before processing, in the left part, as indicated with the letter "A". FIG. 5 further shows the FWM signal obtained from a processed piece of carbon nanomaterial 400, i.e. after processing, in the right part, as indicated with the letter "B". The FWM signal decreases upon oxidation providing contrast between oxidized and non-oxidized areas. Since the level of oxidation correlates with electrical properties and FWM signal, the latter can be used to monitor change in electrical properties.

The FWM signal obtained from the processed piece of carbon nanomaterial 400 (FIG. 5, B) clearly shows a dark rectangle. This indicates that an oxidized rectangular area has been patterned onto a piece of carbon nanomaterial. The carbon nanomaterial of FIG. 5 is monolayer graphene. In this way, a rectangle with electrical properties different from that of a base has been patterned. For example, the bang gap of the patterned region (first area 120) may be in the ranges defined for either the first area 120 or the second area 130, as discussed above.

The processed piece of carbon nanomaterial 400 can be used to form an electronic device. In an electronic device the processed piece of carbon nanomaterial 400 is electrically coupled with another object. The other object may be an electrical conductor, an electrical semiconductor, or an electrical insulator. The other object may be a metallic electrical conductor.

For example, the base 115 can form a conductor, the first area 120 can form a semiconductor, and the second area 130 can from an insulator. Therefore, a processed piece of carbon nanomaterial 400 having a semiconducting first area 120 in between two conducting base areas 115 can act as a transistor, such as a field effect transistor (FET). The second area 130 can be used to electrically isolate the first area 120 from a conductor; whereby the conductor can be used to produce an electric field into the first area.

FIG. 4 shows an example of such a processed piece of carbon nanomaterial 400. In the Figure, the base 115 comprises four base areas 115*a*, 115*b*, 115*c*, and 115*d*. The base areas 115*a* and 115*b* are electrically coupled to a semiconducting first area 120. The semiconducting area is made as has been described above for the first area 120. Moreover, the processed piece of carbon nanomaterial 400 comprises insulating second areas 130.

With reference to FIG. 4, an insulating area, or insulating areas 130, is/are used to electrically insulate, from each other, such conductive areas 115*a* and 115*b* that are electrically connected to the semiconducting area 120.

In FIG. 4, wherein the piece 400 comprises further conductive base areas 115*c* and 115*d*, the insulating areas 130 are used to isolate the conductive areas 115*a* and 115*b* also from the other base areas 115*c* and 115*d* in order not to form an electric short circuit between the areas 115*a* and 115*b* that are electrically coupled to the semiconducting area 120. The conductive areas 115*c* and/or 115*d* can be used to generate an electric field to the semiconducting first area 120.

Such a transistor comprises
a processed piece of carbon nanomaterial 400, and
means for affecting the electrical conductivity of the first area 120.

The means for affecting the electrical conductivity may comprise e.g. an electrical conductor (e.g. 115*c* and/or 115*d*) electrically insulated, e.g. by the second area 130, from the first area 120, thereby arranged to generate an electric field into the first area 120.

Examples

1. A method for patterning a piece of carbon nanomaterial, wherein the piece of carbon nanomaterial has a length, a width, and a thickness, such that the length is greater than or equal to the thickness, the width is greater than or equal to the thickness, and the thickness is at most 50 nm, the piece of carbon nanomaterial comprises a region, wherein the region comprises at least 80 mol-% carbon atoms and in the region, the molar ratio of oxygen to carbon has a base value that is equal to or greater than zero, the region comprises a first area in such a way that the first area is smaller than the region; whereby the region and the first area define a base that is comprised by the difference of the region and the first area; the method comprising generating a first light pulse sequence with first light pulse sequence property values, the first light pulse sequence comprising at least one light pulse and exposing the first area to said first light pulse sequence in a first process environment having a first oxygen content, without exposing at least part of the base to said first light pulse sequence; thereby oxidizing locally, in the first area, at least some carbon atoms of the piece of carbon nanomaterial in such a way that at most 10% of the carbon atoms of the first area are removed from the first area and after said exposing the first area to said first light pulse sequence, in the first area, the molar ratio of oxygen to carbon atoms has a first value, the first value being greater than the base value; thereby patterning the first area of the piece of carbon nanomaterial.

2. A method for patterning a piece of carbon nanomaterial, wherein the piece of carbon nanomaterial is obtainable, by bending or rolling, from a sample of carbon nanomaterial having a length, a width, and a thickness, wherein the length sample of carbon nanomaterial is greater than or equal to the thickness, the width is greater than or equal to the thickness, and the thickness is at most 50 nm; wherein the piece of carbon nanomaterial comprises a region, wherein the region comprises at least 80 mol-% carbon atoms and in the region, the molar ratio of oxygen to carbon has a base value that is equal to or greater than zero, the region comprises a first area in such a way that the first area is smaller than the region; whereby the region and the first area define a base that is comprised by the difference of the region and the first area; the method comprising generating a first light pulse sequence with first light pulse sequence property values, the first light pulse sequence comprising at least one light pulse and exposing the first area to said first light pulse sequence in a first process environment having a first oxygen content, without exposing at least part of the base to said first light pulse sequence; thereby oxidizing locally, in the first area, at least some carbon atoms of the piece of carbon nanomaterial in such a way that at most 10% of the carbon atoms of the first area are removed from the first area and after said exposing the first area to said first light pulse sequence, in the first area, the molar ratio of oxygen to carbon atoms has a first value, the first value being greater than the base value; thereby patterning the first area of the piece of carbon nanomaterial.

3. The method of example 1 or 2, wherein the piece of carbon nanomaterial further comprises a second area, and by said exposing the first area, the method comprises using a first set of values of process parameters to oxidize the first area, wherein the first set of values of process parameters comprises the first light pulse sequence property values and the first oxygen content; the method further comprising changing at least one value of a process parameter of the first set of values of process parameters thereby generating a second set of values of process parameters, wherein at least a value of a process parameter in the first set of values of process parameters is different from the value of the process parameter in the second set of values of process parameters, generating a second light pulse sequence with second light pulse sequence property values, the second light pulse sequence property values comprised by the second set of values of process parameters, the second light pulse sequence comprising at least one light pulse, and exposing the second area to said second light pulse sequence (a) in the process environment having a second oxygen content or (b) in another process environment having a second oxygen content, the second oxygen content comprised by the second set of values of process parameters; thereby using the second set of values of process parameters to oxidize at least some carbon atoms locally in the second area in such a way that at most 10% of the carbon atoms of the second area are removed from the second area and after said exposing the second area to said second light pulse sequence, in the second area, the molar ratio of oxygen to carbon atoms has a second value, the second value being greater than the base value and different from the first value.

4. The method of any of the examples 1 to 3, wherein the second area is exposed to said second light pulse sequence in such a way that at least part of the base is exposed neither to the first light pulse sequence nor the second light pulse sequence.

5. The method of any of the examples 1 to 4, wherein the piece of carbon nanomaterial comprises a monolayer of graphene or multilayer graphene comprising a number of graphene monolayers, such as at most 30 monolayers, a carbon nanotube, such as a single wall carbon nanotube (SWCNT) or a multi wall carbon nanotube (MWCNT), or a net of carbon nanotubes attached to each other e.g. from their ends.

6. The method of any of the examples 1 to 5, wherein the piece carbon nanomaterial comprises, preferably consists of, a monolayer of graphene, optionally at most partly oxidized, or multilayer graphene comprising a number of graphene monolayers, wherein the number is at most 30, optionally chemically treated on at least a surface.

7. The method of any of the examples 1 to 6, wherein the first light pulse sequence is generated using a first laser light source;

optionally, also the second light pulse sequence is generated using a laser light source, such the first laser light source or another laser light source.

8. The method of any the examples 1 to 7, wherein the first light pulse sequence is conveyed from the first laser light source onto the first area without being at least partly blocked by an opaque area of a passive mask, through which the first light pulse sequence is arranged to run.

9. The method of any the examples 1 to 8, comprising modifying the spatial profile of a light pulse of a light pulse sequence using a spatial light modulator.

10. The method of any of the examples 1 to 9, wherein a light pulse of the first light pulse sequence comprises photons having a wavelength from 250 nm to 1100 nm.

11. The method of any of the examples 1 to 10, wherein
   a light pulse of the first light pulse sequence has an intensity from $10^9$ W/(cm)$^2$ to $10^{14}$ W/(cm)$^2$; such as from $7 \times 10^{10}$ W/(cm)$^2$ to $7 \times 10^{11}$ W/(cm)$^2$.
12. The method of any of the examples 1 to 11, wherein the first oxygen content is at least 0.4 mol/m$^3$.
13. The method of any of the examples 1 to 12, wherein the first oxygen content is at most 100 mol/m$^3$, such as at most 40 mol/m$^3$ or at most 10 mol/m$^3$.
14. The method of any of the examples 1 to 13 comprising
   focusing the first light pulse sequence using focusing optics to decrease the cross sectional area of a light pulse of the first light pulse sequence.
15. The method of any of the example 1 to 14 wherein
   the first light pulse sequence comprises a light pulse or light pulses having a longest wavelength, the method comprising
   using a waveguide to guide the first light pulse sequence from a light source to an end of the waveguide, in such a way that
   the closest distance between the end of the waveguide and the piece of carbon nanomaterial is at most the longest wavelength; to pattern an area having a line width less than or equal to the wavelength of the light pulse of the first light pulse sequence.
16. The method of any of the examples 1 to 15, wherein
   the band gap of at least part of the base is at most 0.01 eV and
   the first area is oxidized in such a way that the band gap of the first area is more than the band gap of the base.
17. The method of the example 16, wherein
   the first area is oxidized in such a way that the band gap of the first area is more than 0.05 eV, such as at least 0.1 eV.
18. The method of the example 16 or 17, wherein
   the first area is oxidized in such a way that the band gap of the first area is less than 3 eV.
19. The method of any of the examples 3 to 18, wherein
   the second area is oxidized according to example 3, and
   the second area is oxidized in such a way that the band gap of the second area is
   more than the band gap of the first area, and
   optionally, at least 3 eV.
20. A processed piece of carbon nanomaterial having
   a length, a width, and a thickness, wherein
   the length is greater than or equal to the thickness, the width is greater than or equal to the thickness, and the thickness is at most 50 nm, the processed piece of carbon nanomaterial comprising
   at least 80 mol-% carbon atoms,
   a base having a part, at least the part of the base comprising carbon atoms and optionally also oxygen atoms in such a way that the molar ratio of oxygen to carbon has a base value that is equal to or greater than zero,
   a first area comprising carbon atoms and oxygen atoms in such a way that the molar ratio of oxygen to carbon has a first value that is greater than the base value, and
   a second area comprising carbon atoms and oxygen atoms in such a way that the molar ratio of oxygen to carbon has a second value that is greater than the base value and different from the first value.
21. A processed piece of carbon nanomaterial obtainable by bending or rolling a sample of carbon nanomaterial having a length, a width, and a thickness, wherein
   the length is greater than or equal to the thickness, the width is greater than or equal to the thickness, and the thickness is at most 50 nm;
   the processed piece of carbon nanomaterial comprising
   at least 80 mol-% carbon atoms,
   a base having a part, at least the part of the base comprising carbon atoms and optionally also oxygen atoms in such a way that the molar ratio of oxygen to carbon has a base value that is equal to or greater than zero,
   a first area comprising carbon atoms and oxygen atoms in such a way that the molar ratio of oxygen to carbon has a first value that is greater than the base value, and
   a second area comprising carbon atoms and oxygen atoms in such a way that the molar ratio of oxygen to carbon has a second value that is greater than the base value and different from the first value.
22. The processed piece of carbon nanomaterial of example 20 or 21 comprising
   a monolayer of graphene or multilayer graphene comprising a number of graphene monolayers, such as at most 30 monolayers,
   a carbon nanotube, such as a single wall carbon nanotube (SWCNT) or a multi wall carbon nanotube (MWCNT), or
   a net of carbon nanotubes attached to each other e.g. from their ends.
23. The processed piece of carbon nanomaterial of any of the examples 20 to 22, that comprises, preferably consists of
   a monolayer of graphene, optionally at most partly oxidized, or
   multilayer graphene comprising a number of graphene monolayers, wherein the number is at most 30, optionally chemically treated on at least a surface.
24. The processed piece of carbon nanomaterial of any of the examples 20 to 23, wherein
   the band gap of the part of the base is at most 0.01 eV, and
   the band gap of the first area is more than the band gap of the part of the base.
25. The processed piece of carbon nanomaterial of the example 24, wherein
   the band gap of the first area is more than 0.05 eV, such as at least 0.1 eV.
26. The processed piece of carbon nanomaterial of the example 24 or 25, wherein
   the band gap of the first area less than 3 eV.
27. The processed piece of carbon nanomaterial of any of the examples 20 to 26, wherein
   the band gap of the second area is more than the band gap of the first area and, optionally, at least 3 eV.
28. The processed piece of carbon nanomaterial of any of the examples 20 to 27, wherein
   the first area has a line width, a line length, and a line thickness, the line thickness being parallel to the thickness of a layer of the piece of carbon nanomaterial or the processed piece of carbon nanomaterial, the line width being perpendicular to the line length and perpendicular to the line thickness, and the line width being at most the line length, wherein
   the line width is adapted to be suitable for electronic devices, such as at most 1 mm, at most 10 µm, at most 700 nm or at most 300 nm.
29. The processed piece of carbon nanomaterial of any of the examples 20 to 28, wherein
   at least some carbon atoms has been removed from a processed area, whereby
   the first area or the second area comprises a groove.
30. An electronic device comprising
   the processed piece of carbon nanomaterial of any of the examples 20 to 29, and another object, electrically coupled to the processed piece of carbon nanomaterial.
31. A transistor comprising
the processed piece of carbon nanomaterial of any of the examples 20 to 30,
another object, electrically coupled to the processed piece of carbon nanomaterial and
means for affecting the electrical conductivity of the first area.
32. The electronic device of the example 30 or the transistor of the example 31, wherein
the other object is an electrical conductor or an electrical semiconductor.
33. The electronic device, such as the transistor, of example 32, wherein
the other object is a metallic electrical conductor.

The invention claimed is:
1. A method for patterning a piece of carbon nanomaterial, wherein
the piece of carbon nanomaterial (i) has a length, a width, and a thickness or (ii) is obtainable, e.g. by bending or rolling, from a sample of carbon nanomaterial having a length, a width, and a thickness, wherein
the length is greater than or equal to the thickness, the width is greater than or equal to the thickness, and the thickness is at most 50 nm,
the carbon nanomaterial comprises (i) a monolayer of graphene or (ii) multilayer graphene comprising a number of graphene monolayers, wherein the number is at most 30
the piece of carbon nanomaterial comprises a region, in which the molar ratio of oxygen to carbon has a base value that is equal to or greater than zero,
the region of the piece of carbon nanomaterial comprises at least 80 mol-% carbon atoms,
the region comprises a first area in such a way that the first area is smaller than the region;
whereby the region and the first area define a base that is comprised by the difference of the region and the first area;
the method comprising
generating a first light pulse sequence with first light pulse sequence property values, the first light pulse sequence comprising at least one light pulse,
exposing the first area to said first light pulse sequence in a first process environment having a first oxygen content, without exposing at least part of the base to said first light pulse sequence, wherein
generating the first light pulse sequence using a laser, such that a light pulse of the first light pulse sequence comprises photons having a wavelength from 400 nm to 1100 nm, thereby
oxidizing locally, in the first area, at least some carbon atoms of the piece of carbon nanomaterial by two-photon or multiphoton oxidation, in such a way, that
at most 10% of the carbon atoms of the first area are removed from the first area and
after said exposing the first area to said first light pulse sequence, in the first area, the molar ratio of oxygen to carbon atoms has a first value, the first value being greater than the base value;
thereby
patterning the first area of the piece of carbon nanomaterial, wherein
the light pulse of the first light pulse sequence has an intensity from $10^9$ W/(cm)$^2$ to $10^{14}$ W/(cm)$^2$.

2. The method of claim 1, wherein
the piece of carbon nanomaterial further comprises a second area and
by said exposing the first area, the method comprises using a first set of values of process parameters to oxidize the first area, wherein the first set of values of process parameters comprises the first light pulse sequence property values and the first oxygen content; the method further comprising
changing at least one value of a process parameter of the first set of values of process parameters thereby generating a second set of values of process parameters, wherein at least a value of a process parameter in the first set of values of process parameters is different from the value of the process parameter in the second set of values of process parameters,
generating a second light pulse sequence with second light pulse sequence property values, the second light pulse sequence property values comprised by the second set of values of process parameters, the second light pulse sequence comprising at least one light pulse, and
exposing the second area to said second light pulse sequence in the process environment having a second oxygen content or in another process environment having a second oxygen content, the second oxygen content comprised by the second set of values of process parameters; thereby
using the second set of values of process parameters to oxidize at least some carbon atoms locally in the second area in such a way that
at most 10% of the carbon atoms of the second area are removed from the second area and
after said exposing the second the area to said second light pulse sequence, in the second area, the molar ratio of oxygen to carbon atoms has a second value, the second value being greater than the base value and different from the first value.

3. The method of claim 1, wherein the carbon nanomaterial further comprises
a carbon nanotube, such as a single wall carbon nanotube (SWCNT) or a multi wall carbon nanotube (MWCNT), or
a net of carbon nanotubes attached to each other e.g. from their ends; and
the method comprises patterning graphene.

4. The method of claim 1, wherein the intensity of the light pulse of the first light pulse sequence is from $7 \times 10^{10}$ W/(cm)$^2$ to $7 \times 10^{11}$ W/(cm)$^2$.

5. The method of claim 1, wherein the monolayer of graphene is at most partly oxidized.

6. The method of claim 1, wherein the multilayer graphene is chemically treated on at least a surface.

7. The method of the claim 1, wherein the carbon nanomaterial consists of the monolayer of graphene, or
the multilayer graphene comprising a number of graphene monolayers, wherein the number is at most 30.

8. The method of claim 7, wherein the monolayer of graphene is at most partly oxidized.

9. The method of claim 7, wherein the multilayer graphene is chemically treated on at least a surface.

10. The method of claim 1, wherein
the first oxygen content is at least 0.4 mol/m$^3$.

11. The method of claim 10, wherein the first oxygen content is at most 100 mol/m$^3$.

12. The method of claim 10, wherein the first oxygen content is from 0.4 mol/m$^3$ to 40 mol/m$^3$.

13. The method of claim 1, wherein—the band gap of at least part of base is at most 0.01 eV and—the first area is oxidized in such a way that the band gap of the first area is more than 0.05 eV.

14. The method of claim 13, wherein the band gap of the first area is at least 0.1 eV.

15. The method of claim 2, wherein—the second area is oxidized in such a way that the band gap of the second area is more than the band gap of the first area and, optionally, the band gap of the second area is more than 2 eV.

16. The method of claim 15, wherein the band gap of the second area is at least 3 eV.

17. The method of claim 1, wherein the first area has a line width, a line length, and a line thickness, the line width being perpendicular to the line length and perpendicular to the line thickness, and the line width being at most the line length, wherein the line width is adapted to be suitable for electronic devices.

* * * * *

UNITED STATES PATENT AND TRADEMARK OFFICE
CERTIFICATE OF CORRECTION

PATENT NO. : 10,475,651 B2
APPLICATION NO. : 15/307176
DATED : November 12, 2019
INVENTOR(S) : Mika Pettersson et al.

Page 1 of 1

It is certified that error appears in the above-identified patent and that said Letters Patent is hereby corrected as shown below:

On the Title Page

Item (73) Assignee should read:
Jyväskylän yliopisto, Jyväskylä (FI)

Signed and Sealed this
Thirty-first Day of December, 2019

Andrei Iancu
*Director of the United States Patent and Trademark Office*